United States Patent [19]

Suzuki et al.

[11] Patent Number: 4,808,845
[45] Date of Patent: Feb. 28, 1989

[54] HIGH VOLTAGE PULSE GENERATING SEMICONDUCTOR CIRCUIT WITH IMPROVED DRIVING ARRANGEMENT

[75] Inventors: Masayoshi Suzuki; Naoyuki Izaki, both of Hitachiota, Japan

[73] Assignee: Hitachi, Ltd., Tokyo, Japan

[21] Appl. No.: 937,051

[22] Filed: Dec. 2, 1986

[30] Foreign Application Priority Data

Dec. 2, 1985 [JP] Japan .................. 60-269260

[51] Int. Cl.⁴ .................. H03K 3/01; H03K 17/60; G06G 7/12
[52] U.S. Cl. .................. 307/270; 307/544; 307/558; 307/446; 307/570; 307/300; 307/264
[58] Field of Search .............. 307/264, 255, 270, 446, 307/570, 300, 542, 544, 552, 558, 559, 564, 304

[56] References Cited

U.S. PATENT DOCUMENTS

| | | | |
|---|---|---|---|
| 3,702,946 | 11/1972 | Kraft | 307/300 |
| 3,751,682 | 8/1973 | Howe | 307/270 |
| 4,359,650 | 11/1982 | Newcomb | 307/270 |
| 4,407,055 | 9/1983 | Romano | 307/270 |
| 4,491,744 | 1/1985 | Corey | 307/270 |
| 4,544,934 | 10/1985 | Owada et al. | 307/270 |
| 4,578,597 | 3/1986 | Soneda et al. | 307/270 |
| 4,749,884 | 6/1988 | Karban et al. | 307/270 |

FOREIGN PATENT DOCUMENTS

| | | |
|---|---|---|
| 0019932 | 2/1977 | Japan . |
| 0162543 | 12/1981 | Japan . |
| 0051024 | 3/1985 | Japan . |
| 0057724 | 4/1985 | Japan . |

*Primary Examiner*—Stanley D. Miller
*Assistant Examiner*—Tai V. Duong
*Attorney, Agent, or Firm*—Antonelli, Terry & Wands

[57] ABSTRACT

A semiconductor electronic circuit, which can generate high voltage pulses, includes a current source coupled to form a series circuit with a pair of impedances between first and second voltage source terminals. A driving source is connected with a control terminal of the current source. Output voltage-current characteristics of the driving source are such that its output current is almost 0, when the output voltage is in the proximity of 0 V and that it is not 0 for other voltages. Thus, the voltage at the control terminal of the current source is clamped at a predetermined voltage level determined by the circuit structure of the driving source, when the voltage at the output terminal is lower than the predetermined voltage.

28 Claims, 13 Drawing Sheets

F I G. 4
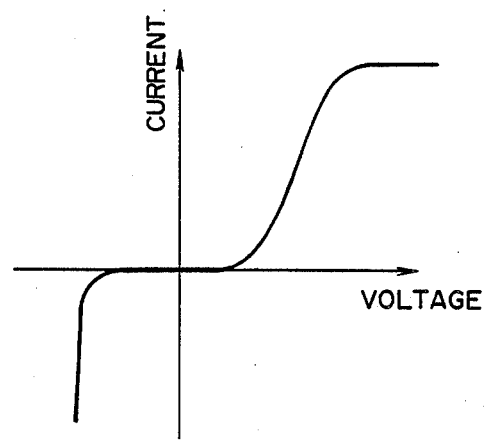

HIGH VOLTAGE PULSE GENERATING SEMICONDUCTOR CIRCUIT WITH IMPROVED DRIVING ARRANGEMENT

BACKGROUND OF THE INVENTION

This invention relates to a semiconductor electronic circuit, and, in particular, to a semiconductor electronic circuit which can generate high voltage pulses.

Circuit systems are known in which several circuit elements are connected in series in order to obtain a high voltage output. Prior art devices, in which a plurality of transistors are connected in series and their bases are driven simultaneously, are disclosed in JP-A-No. 52-19932, JP-A-No. 56-162543, JP-A-No. 60-51024, JP-A-No. 60-57724, etc. FIG. 2 illustrates a respective circuit construction of such devices.

In FIG. 2 transistors 1 and 2 are connected in series and resistors 3 and 4 are resistors short-circuiting the base and the emitter of each of the transistors. A driving signal is inputted through capacitors 5 and 6, respectively. The reference numeral 7 represents a driving signal source. The transistors 1 and 2 work as if they were a single transistor, one end of which is connected through a load resistor 9 with a voltage source terminal 8 and the other end of which is connected with another voltage source terminal 11. The output terminal is designated by 10 and in many cases voltage amplitude signals appearing there are used as the output.

By this circuit system it is possible to obtain a high withstand voltage owing to the superposition of many transistors. However, the operation speed of the circuit is slow, because it has no discharge path, in the case where the load is capacitive.

FIG. 3 indicates a method for resolving this problem. It is a so-called push-pull circuit construction, by which complementary transistors 12 and 13 are combined. The output terminal 10 is taken-out from the transistor connection point, through which electric power is transferred to the load. By this circuit system it is possible to increase the working speed, but the withstand voltage of the transistor elements 12 and 13 should be raised, in order that the circuit can be used as a high withstand voltage circuit. Further, if each of the transistors 12 and 13 in FIG. 3 actually consists of a plurality of transistors, as is the case for the transistors 1 and 2 in FIG. 2, a high withstand voltage can be obtained. However, in the case where complementary transistors are used as in the circuit indicated in FIG. 3, it is difficult to balance the p and the n conductivity type and particular attention should be paid to how to drive the circuit. In addition, capacitors having a relatively large capacitance are used for coupling the signal source 7 with the base of the transistor, and fairly sophisticated techniques are necessary for fabricating high withstand voltage capacitors.

SUMMARY OF THE INVENTION

An object of this invention is to provide a voltage pulse generating circuit having a simple circuit construction which permits realizing a high withstand voltage, and, in particular, an electronic circuit suitable for generating positive and negative pulses.

In a series connection type high withstand voltage circuit according to prior art techniques, it is fairly difficult to divide a voltage equally to all the constituent elements. This is caused by the fact that capacitors or coils are used as coupling means for signals as indicated in FIG. 3. Also, the potential of the base of the transistors can hardly be determined, when there are no signals. That is, if a definite base-drive is possible and the base potential is fixed certainly, when there are no signals, a high voltage pulse generating circuit working very stably can be realized. This invention utilizes this principle in an ingenious manner. FIG. 1 shows the principle, in which the reference numeral 14 indicates a current source, controlled by electric signals coming from a driving source 17, which is in turn controlled by a signal source 7A. Voltage sources are connected with the terminals 8 and 11, which are connected through impedance elements 15 and 16 with a current source 14.

FIG. 4 shows a voltage-current characteristic curve of the driving source 17 in FIG. 1. It has characteristics that, when the voltage of the driving source 17 exceeds a certain value, current begins to flow and when the voltage decreases to 0 V, the current decreases also to 0. On the other hand its reverse direction characteristics are such that at first in the proximity of 0 V almost no current flows and that when the voltage exceeds a certain value, the current increases rapidly.

FIG. 5 shows a representative waveform in the circuit indicated in FIG. 1. An output $V_0$ is produced for an input voltage $V_I$. At this time the amplitude of the output pulse $V_0$ varies from $V_{ss}$ to $V_{cc}$, which are source voltages. At the same time the output voltage $V_1$ of the driving source 17 varies from $V_{ss}$ to a predetermined voltage $V_c$ of a certain level (which is determined by the form of the circuit of the driving source and most preferably about $\frac{1}{2}$ of $|V_{ss}| + |V_{cc}|$ on the basis of the working condition). In a prior art circuit the voltage $V_1$ varies as indicated by the broken line and the lowest level arrives at the proximity of $V_{cc}$. For this reason an overvoltage, which is the sum of $V_{ss}$ and $V_{cc}$, is applied to the element 15, which gives rise to destruction of the element 15 itself.

According to this invention, since the driving source 17 having the characteristics indicated in FIG. 4 is connected with the control terminal of the current source 14, the lowest level of the voltage $V_1$ is clamped at the predetermined voltage $V_c$ and thus the element 15 cannot be destroyed by overvoltage.

Other objects and effects of this invention will be understood from the description of the preferred embodiments stated below.

BRIEF DESCRIPTION OF THE DRAWINGS

FIGS. 4 and 5 are schemes for explaining the principle of this invention.

DESCRIPTION OF THE PREFERRED EMBODIMENTS

Figure 6:
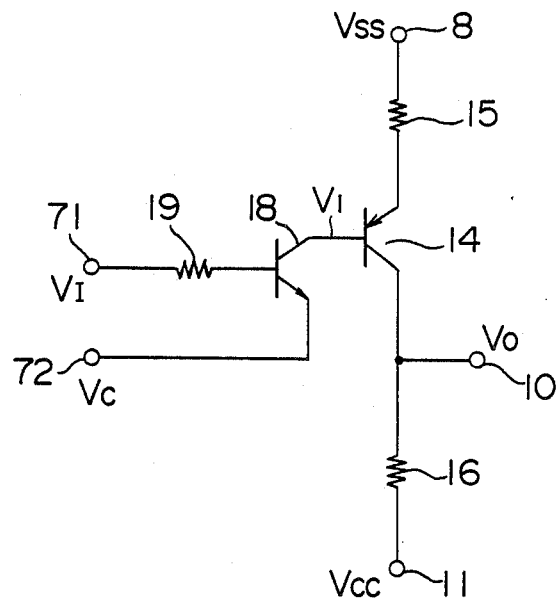
FIGS. 6 to 12 are schemes illustrating various concrete embodiments of this invention.

FIG. 6 indicates a concrete embodiment of this invention, in which the same items as those in the explanation stated above are designated by the same reference numerals.

A PNP transistor 14 constitutes the current source and the impedance elements are realized by resistors 15 and 16. An NPN transistor 18 and a resistor 19 form the driving source for the transistor 14.

Figure 1:
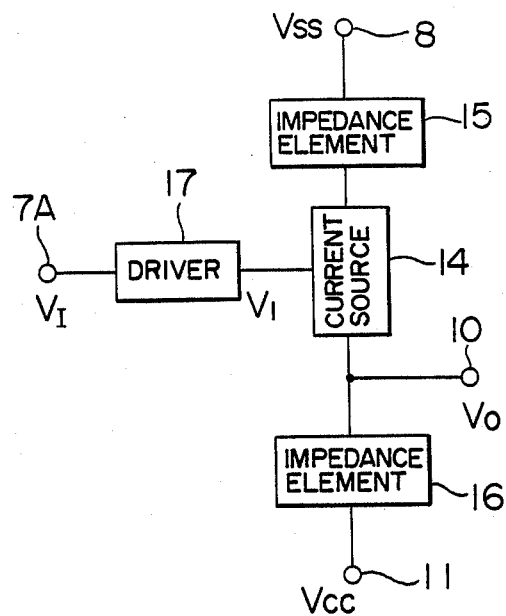
FIG. 1 is a scheme indicating the principle of this invention.
Figure 2:
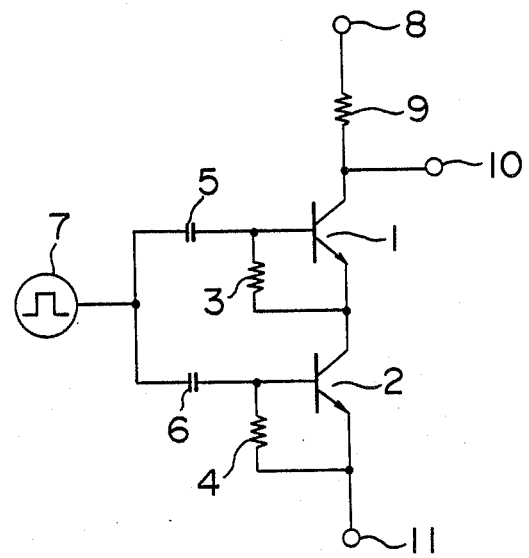
FIGS. 2 and 3 show two different constructions of prior art circuits.
Figure 3:
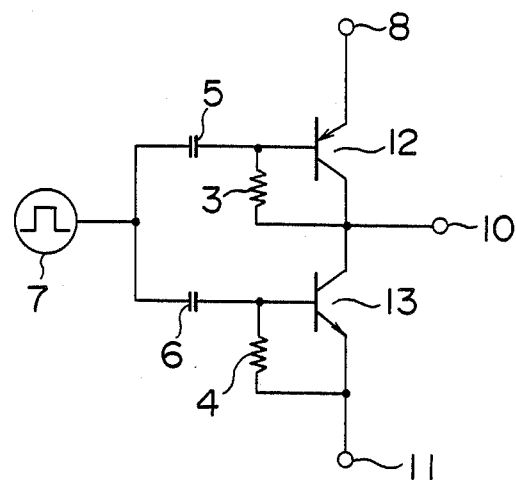
Figure 5:
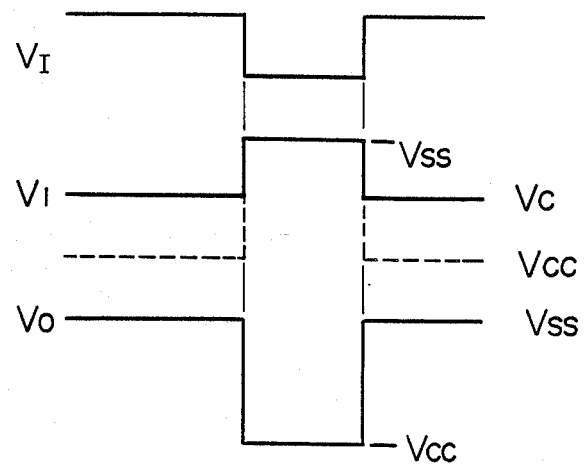

In this circuit, when a certain voltage is applied to input terminals 71 and 72, the transistor 18 becomes conductive. At this time the collector-emitter voltage $V_1$ and the collector current of the transistor 18 vary as shown by the characteristic curve in FIG. 4 and therefore satisfy the characteristics necessary for the driving source for realizing this invention. At the same time the voltage is applied the transistors 18 and 14 become conductive and a current flows through the resistor 16 and a voltage drop is produced thereacross. Consequently the voltage $V_0$ at the output terminal 10 rises beyond the source voltage $V_{cc}$ towards the voltage $V_{ss}$. This rise stops at the point where the transistor 14 is saturated. At this time almost the entire voltage, which is equal to the sum of $V_{ss}$ and $V_{cc}$, is applied to the resistor 16. Then, when the voltage $V_I$ decreases to "0", the transistor 18 becomes cut-off. Although there is some delay due to the accumulation effect, the transistor 14 becomes cut-off in a short time and the output voltage $V_0$ falls towards $V_{cc}$. During this fall period $V_0$ passes through the ground voltage $V_c$ of the driving circuit. The voltage $V_0$ is almost equal to $V_1$ (they differ by about 0.7 V from each other for silicon transistors). When this value reaches $V_c$, the collector-emitter voltage of the transistor 18 is 0 and the working point is in the proximity of the point 0 in FIG. 4. At this time, since the transistors 18 and 14 are in the cut-off state, only a small current flows therebetween. Therefore, while the voltage drop $V_1$ is kept approximately at 0 and even if $V_{cc}$ reaches its lowest point, this value is maintained. In this way the output waveforms $V_1$ and $V_0$ indicated in FIG. 5 can be obtained.

That is, in this case, since the collector voltage of the transistor 18 is clamped to 0 V, when $V_0$ is at the level of $V_{cc}$, the sum of the source voltages ($V_{ss}+V_{cc}$) can be shared precisely by the collector junction of the transistor 14 and the resistor 15. For example, for $V_{ss}=100$ V, $V_c=0$ V and for $V_{ss}=-100$ V, $V_1=0$ and since each of the resistor 15 and the collector junction of the transistor 14 bears 100 V, the circuit may be so designed that the withstand voltage of each element is 100 V.

Figure 13:
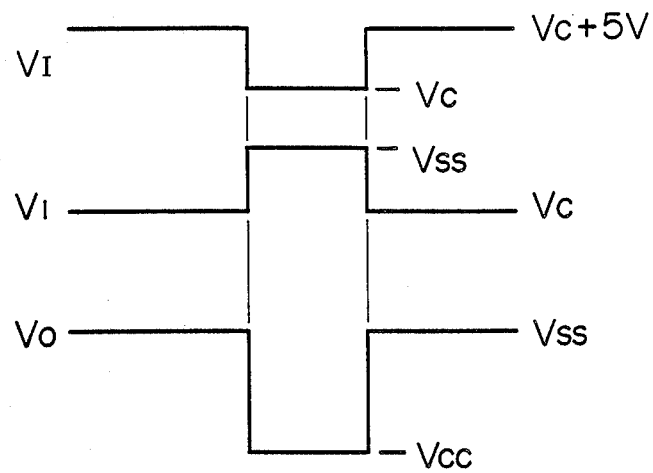
FIGS. 13 to 17 are schemes showing the time sequence for explaining the working mode of the circuits indicated in FIGS. 6 to 12.

FIG. 13 shows the time sequence of the working mode of the circuit indicated in FIG. 6. When the input voltage $V_I$ is at the level "1" (high level), i.e. when it is at a level obtained by adding 5 V to the voltage $V_c$, the transistor 18 is switched on and subsequently the transistor 14 is also switched on. When the value of the resistor 15 is so chosen that it is lower than that of the resistor 16, the voltage $V_1$ is approximately equal to the source voltage $V_{ss}$. Further, when the base current of the transistor 14 is appropriately chosen (from the viewpoint of the operation the base current is set so as to be sufficiently large for the saturation state), the transistor 14 is saturated and the voltage $V_0$ becomes approximately equal to $V_{22}$. On the other hand, when the voltage $V_I$ reaches approximately the $V_0$ level, the base-emitter current of the transistor 18 becomes 0 and the transistor 18 enters into the cut-off state.

For this reason, since the transistor 14 also enters into the cut-off state, the voltage $V_0$ reaches the source voltage $V_{cc}$. When the voltage $V_0$ reaches $V_{cc}$, the voltage $V_1$ also varies towards $V_{cc}$, following it, but since the characteristics of the transistor 18 are as indicated in FIG. 4, $V_1$ is fixed at the level of $V_c$.

Figure 14:
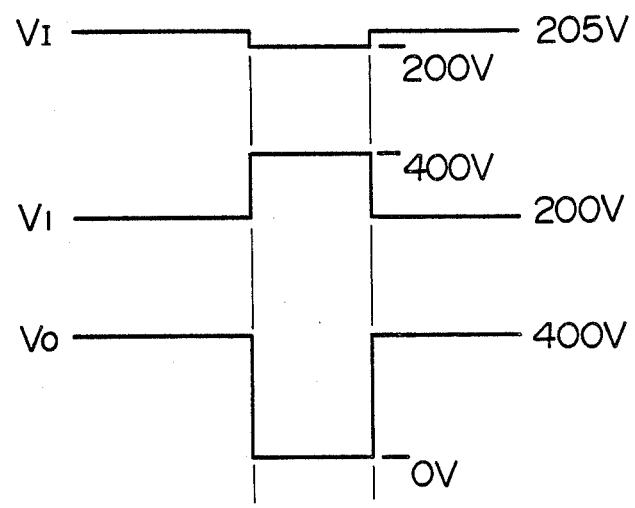

FIG. 14 is a scheme showing the time sequence, in the case where the source voltages are $V_{ss}=400$ V, $V_{cc}=0$ V and $V_c=200$ V in the embodiment indicated in FIG. 6. Since the input signal $V_I$ is controlled by referring to the voltage $V_c$, it varies between 200 V and 205 V. When the voltage $V_I$ is 205 V, both of the transistors 18 and 14 are turned on and the voltages $V_1$ and $V_0$ become 400 V, which is the source voltage. In the case where $V_I$ is 200 V, both the transistors 18 and 14 are turned off, $V_1$ being 200 V, which is $V_{ss}$, $V_0$ being 0 V, which is $V_{cc}$.

Figure 15:
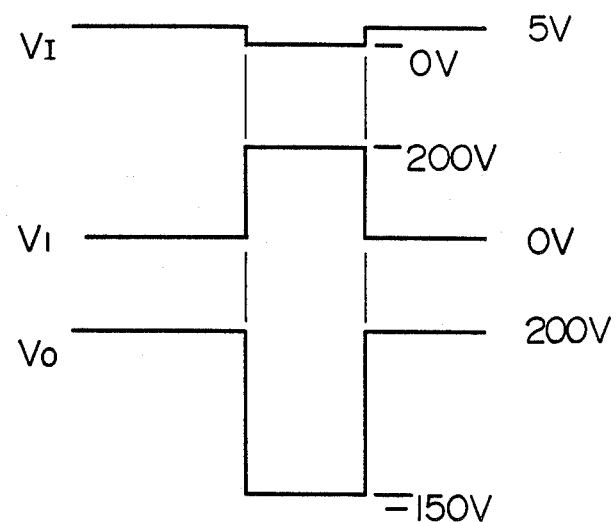

FIG. 15 is a scheme showing the time sequence, in the case where the source voltages $V_{ss}=200$ V, $V_c=0$ V and $V_{cc}=-150$ V in the embodiment indicated in FIG. 6. Input signals $V_I$ between 0 and 5 V are applied. In this case the level of the voltage $V_1$ is 200 V or 0 V and the level of the voltage $V_0$ is 200 V or $-150$ V. Generally, in the case where the voltages $V_{ss}$ and $V_{cc}$ are not equal in their absolute value, when the value of the voltage $V_0$ is selected to be ($V_{ss}+V_{cc}$)/2, it becomes easy to design the transistors 14, 18 with respect to their withstand voltage. That is, in this way the withstand voltage can be shared equally between the two elements.

As has been designed above, according to the prior art techniques the element 15 was easily destroyed, because the base voltage was not clamped to 0 V and varied towards $V_{cc}$. Such can be prevented according to the present embodiment. In the circuit indicated in FIG. 6, however, the withstand voltage of the resistor 16 should be higher than the sum of the source voltages ($V_{ss}+V_{cc}$), because this sum voltage is applied to the resistor 16, when the output voltage is at the level of $V_{ss}$ in spite of its simple structure.

Figure 7:
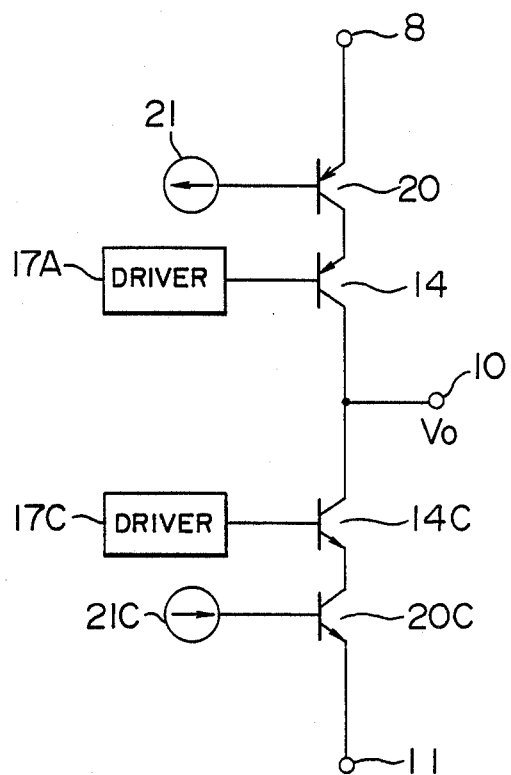

FIG. 7 illustrates another embodiment of this invention, in which the resistor 15 in FIG. 6 is replaced by an active circuit and an equivalent impedance is formed by a combination of a transistor and a power supply 21. A driving source 17A can be realized by the transistor 18 and the resistor 19. Further, in this embodiment transistors 14C and 20C are complementary to the transistors 14 and 20, respectively, and the function of the resistor 16 is represented by the transistors 14C and 20C. By means of this circuit it is possible to obtain voltage pulses at the output terminal 10 by switching on and off the driving sources 17A and 17C alternately. Since this circuit uses nothing which corresponds to the resistors 15 and 16, almost no electric power loss is produced, particularly when a capacitor C, etc. is connected as a load 10 Therefore, stable operation can be expected.

Figure 8:
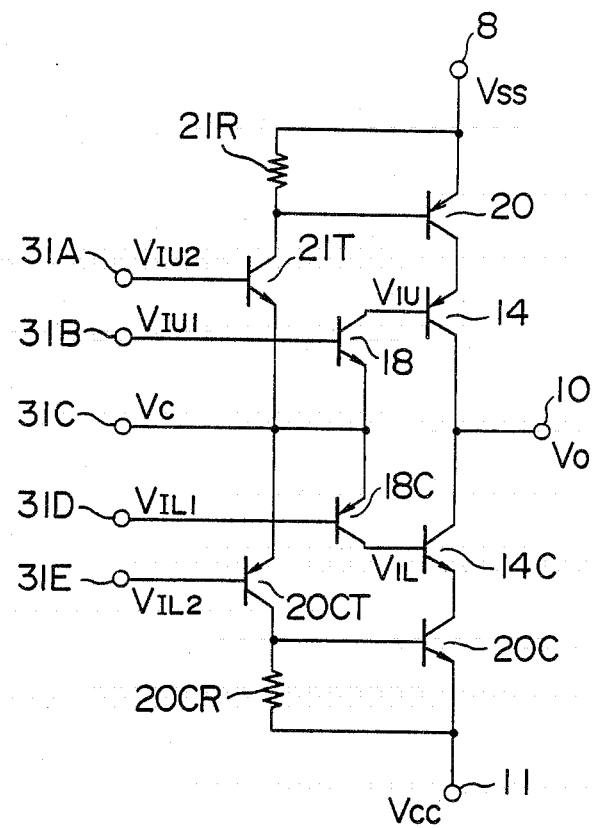

FIG. 8 illustrates still another embodiment of this invention. In this embodiment the transistor 20 and a resistor 21R realizing the equivalent impedance are controlled by another transistor 21. The purpose of this is to make the operation more stable and to reduce electric power consumption. This circuit is a complementary symmetric circuit of p and n conductivity types.

The reference numeral 31 means common terminals; 31A and 31B controlling the transistors 20 and 14; 31D and 31E controlling the transistors 14C and 20C.

Figure 16:
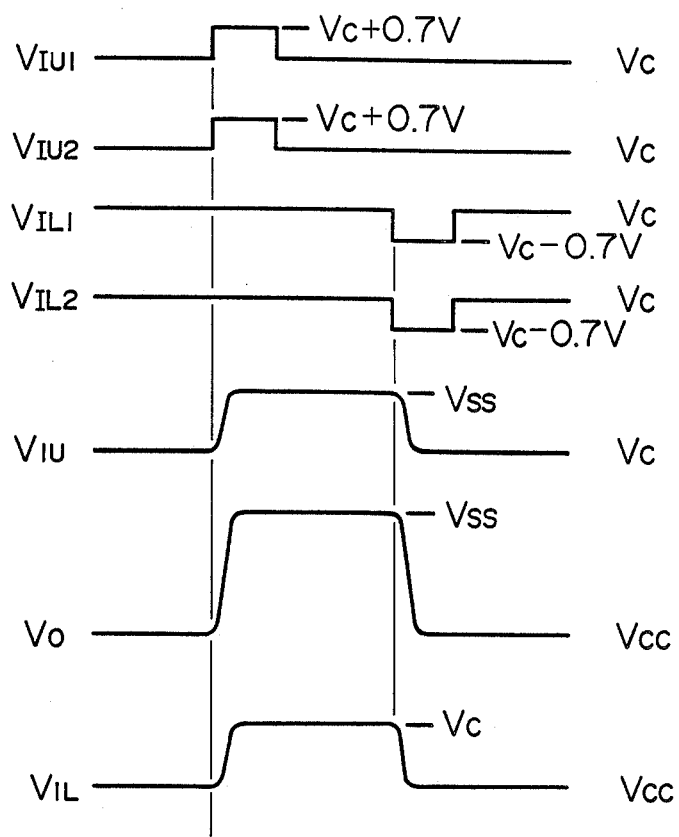

FIG. 16 is a scheme showing the time sequence for the embodiment indicated in FIG. 8. Inputs $V_{IU1}$ and $V_{IU2}$ are controlled between $V_c$ and $V_c+0.7$ V and $V_{IL1}$ and $V_{IL2}$ are controlled between $V_c$ and $V_c-0.7$ V. When the voltages $V_{IU1}$ and $V_{IU2}$ are $V_c+0.7$ V (it is not necessary that these two signals are raised at the same time to the 1 level, as indicated in the figure), transistors 21T, 18, 20, 14 are turned on and $V_0$ reaches the $V_{ss}$ level (at this time $V_{1U}$ also is at $V_{ss}$). On the other hand, since the transistors 14C and 20C are turned off, but $V_{1L}$ is at the $V_c$ level, the voltage between $V_0$ and $V_{cc}$ is shared on halves by the collector junctions of the transistors 14C and 20C.

Next, after having set the voltages $V_{IU1}$ and $V_{IU2}$ at $V_c$, when $V_{IL1}$ and $V_{IL2}$ become $V_c+0.7$ V, the transistors 20CT and 18C are turned on and 14C and 20C also are turned on. In this way the output voltage $V_0$ varies from $V_{ss}$ towards the $V_{cc}$ level and finally settles at the $V_{cc}$ level (at this time $V_{1L}$ passes from $V_c$ to the $V_{cc}$ level). On the other hand, when $V_0$ becomes $V_{cc}$, $V_{1U}$ arrives at the $V_c$ level is is fixed at this potential. When $V_0$ is at the $V_{cc}$ level, the voltage between the source voltages $V_{ss}$ and $V_{cc}$ is shared on halves by the collector junctions of the transistors 20 and 14.

Figure 9:
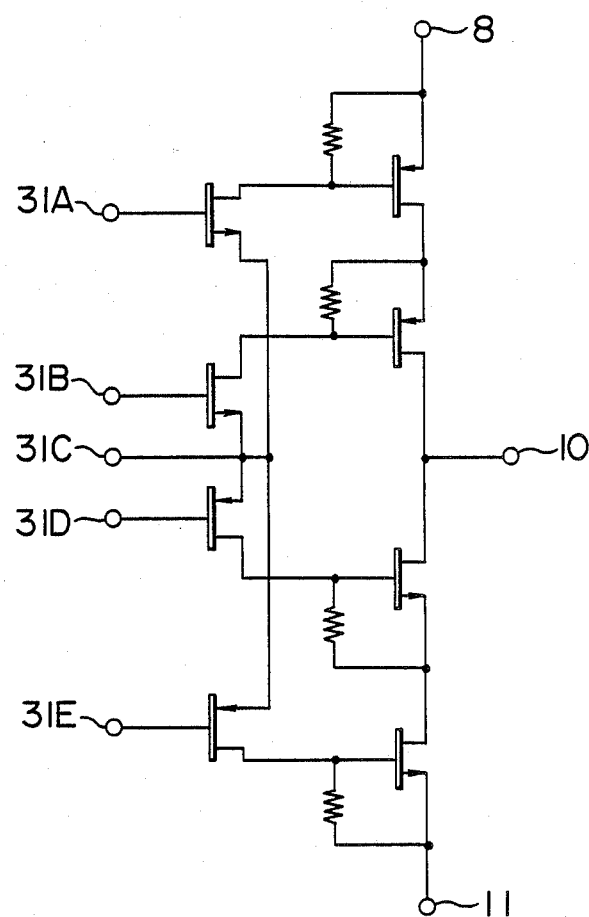

FIG. 9 illustrates still another embodiment of this invention. In this case all the active elements are constituted by field effect transistors (FET) (preferably MOS.FET) and therefore this embodiment has an advantage that the process can be simplified, when they are integrated in one chip.

Figure 10:
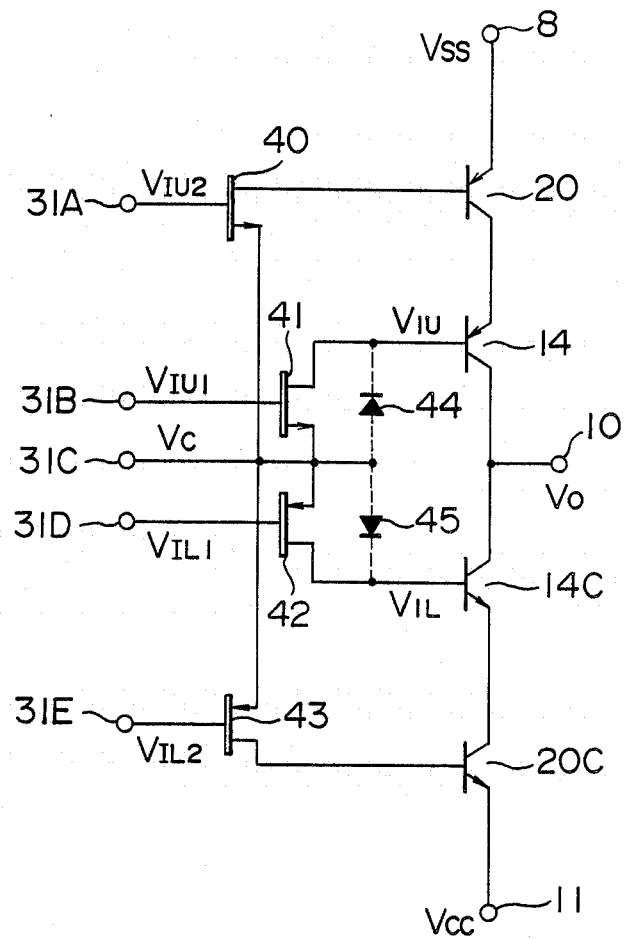

FIG. 10 illustrates still another embodiment of this invention.

In this embodiment the semiconductor element is constituted by bipolar transistors and field effect transistors (FET) (preferably MOS.FET) mixed together. The performance of the circuit is increased owing to the fact that its output stage, for which a particularly high driving power is required, is composed of bipolar transistors 20, 14, 20C and 14C and that the circuit only transmitting signals is composed of FETs 40, 41, 42 and 43. Further, for the FETs, since in some cases their clamp effect due to the characteristics indicated in FIG. 4 is weak, it is preferable to use diodes 44, 45, as indicated by broken lines indicated in the figure, in order to make their clamp action sure.

Figure 17:
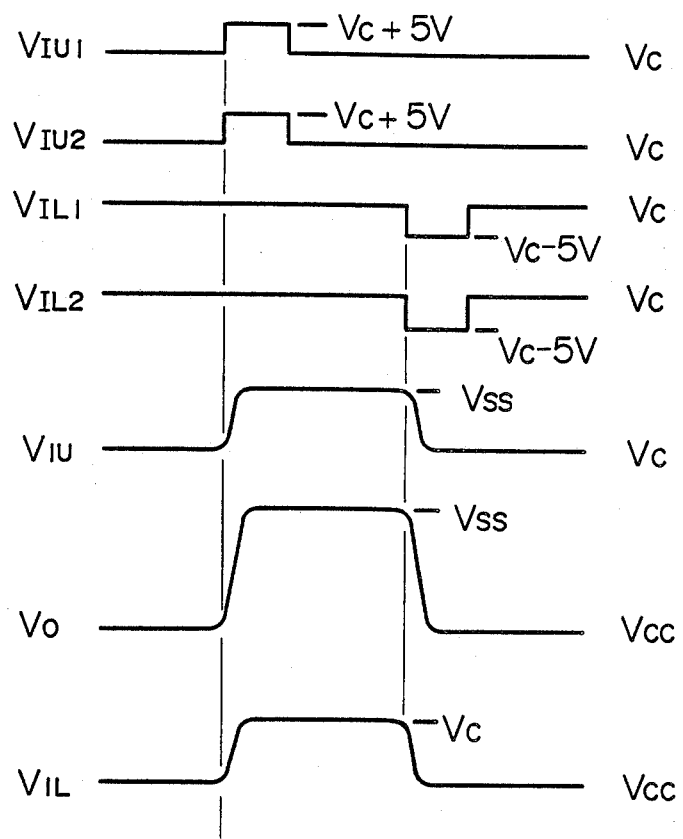

FIG. 17 is a scheme showing the time sequence in the embodiment indicated in FIG. 10. Although the operation time sequence has the same form as that indicated in FIG. 16 showing the sequence for the embodiment illustrated in FIG. 8, since its input stage is constituted by MOS transistors 40, 41, 42 and 43, the amplitude of the input voltages $V_{IU1}$, $V_{IU2}$, $V_{IL1}$ and $V_{IL2}$ is comprised between $V_c$ and $V_c+5$ V or between $V_c$ and $V_c-5$ V. One of the voltage amplitudes $V_{1U}$ and $V_{1l}$ is fixed at $V_c$ in the same way as i the explanation mentioned above.

Figure 11:
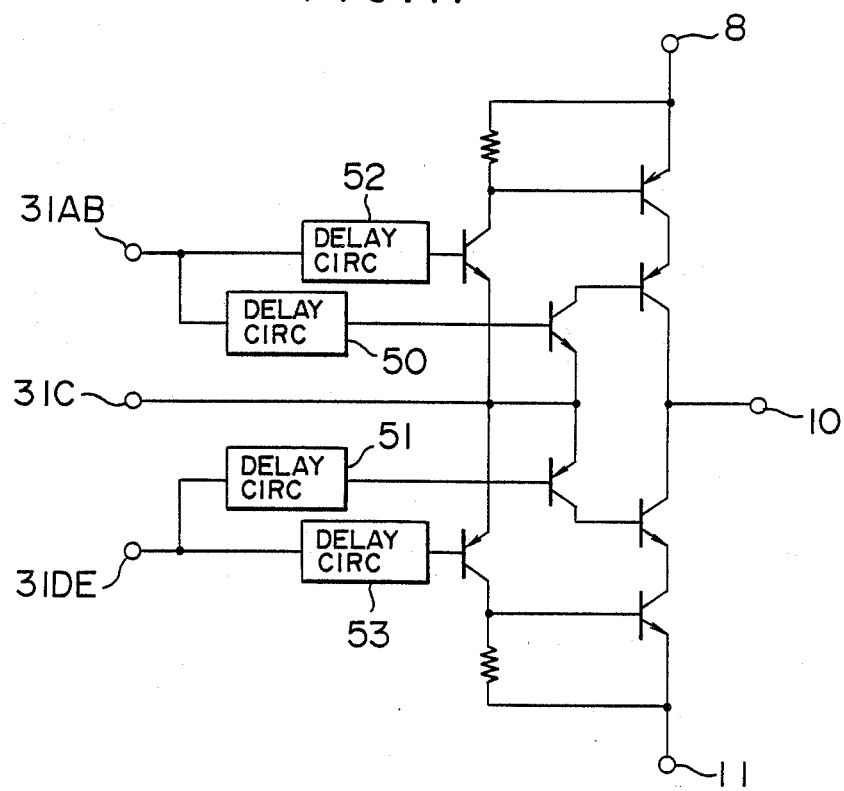

FIG. 11 illustrates still another embodiment of this invention. In this case there are 3 control terminals, among which the terminal 31AB controls the pulse rising portion and the terminal 31DE controls the pulse falling portion. Reference numerals 50, 51, 52 and 53 represent pulse delay circuits. It is possible to ameliorate its characteristics by lowering of electric power consumption and improving waveform generation, operating speed, etc. by choosing appropriately the delay time of each of the pulse delay circuits.

Figure 12:
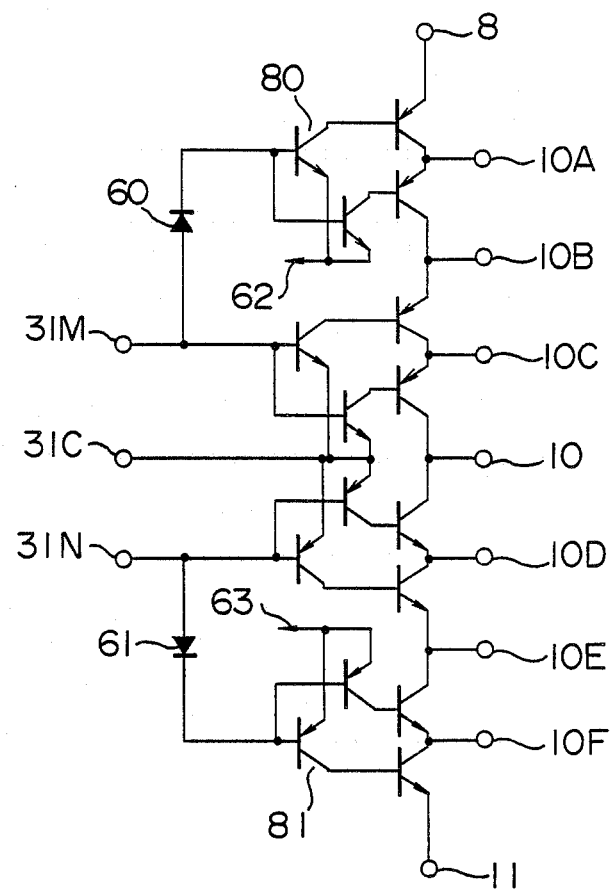

FIG. 12 illustrates a modified circuit according to this invention. In this embodiment basic circuits described in the above embodiments are superposed on each other and a plurality of output terminals 10A, 10B, 10C, 10D, 10E, 10F and 10 are taken out from connection points between two adjacent transistors. Control signals are applied to terminals 31M, 31C and 31N. However, since the potential difference between the circuit group 80 having the terminal 10A on the high voltage side and the control terminal 31M is large, the static capacitance of the junction of a diode 60 biased in the reverse direction is used as a signal coupling means. A terminal 62 is connected to a particular voltage level. The same measures as those described above are taken also for a transistor group 81, a diode 61 and a terminal 63 except for the direction of the voltage to be applied.

In this embodiment it is possible to obtain a plurality of groups of pulses having different levels. Further it is possible to realize voltage pulses having an amplitude twice as large as that obtained in the embodiments described previously at the terminal 10.

The circuits in the embodiments of this invention described above can be used as a drive for capacitive loads such as EL (electroluminescence) structures, plasma displays, piezoelectric motors, ink jet printers, piezo elements, etc.

As explained above, according to this invention, since it is possible to generate high voltage pulses, without any coupling means such as capacitors, etc., it is possible to realize a pulse generating element suitable for intergrated circuits.

Further it is possible to generate pulses, whose output amplitude extends to 2E (V), by constituting the circuits using elements whose withstand voltage (usually collector-emitter withstand voltage) is E (V).

We claim:

1. A semiconductor electronic circuit comprising:
first and second impedance means;
current source means coupled between said first and second impedance means so that said current source means and said first and second impedance means constitute a series circuit, said series circuit being coupled between a first voltage source terminal having a first voltage level applied thereto and a second voltage source terminal having a second voltage level applied thereto;
drive means having an input terminal and coupled to drive said current source means, said drive means including transistor circuit means possessing output current-output voltage characteristics for the drive means such that an output current of said drive means is substantially zero for a zero output voltage or for output volages within a prdetermined vicinity of a zero output voltage, and is not zero for output voltages other than zero voltage or voltages not in the predetermined vicinity of a zero output voltage, wherein the output of said semiconductor electronic circuit is derived from one end of said current source means; and
means for applying a clamp voltage to said transistor circuit means, said clamp voltage being at a voltage level between the first and second voltage levels applied to said first and second voltage source terminals, an input signal to the semiconductor electronic circuit being applied across said input terminal of said drive means and said clamp voltage applying means so that the input signal is superposed on said clamp voltage and so that the voltage of the output of said drive means applied to said current source is clamped to
said clamp voltage depending upon said characteristics of said drive means.

2. A semiconductor electronic circuit according to claim 1, wherein the current source includes a transistor coupled to have a conductive path in said series circuit between the first and second impedance means.

3. A semiconductor electronic circuit according to claim 2, wherein said impedance means are resistors.

4. A semiconductor electronic circuit according to claim 1, wherein said impedance means are active elements.

5. A semiconductor electronic circuit according to claim 4, wherein said active elements include transistors.

6. A semiconductor electronic circuit according to claim 1, wherein said transistor circuit means comprises a transistor coupled between said input signal and said current source means.

7. A semiconductor electronic circuit according to claim 2, wherein said transistor circuit means comprises a transistor coupled between said input signal and the transistor of said current source.

8. A semiconductor electronic circuit according to claim 2, wherein said transistor is an FET.

9. A semiconductor electronic circuit according to claim 5, wherein said transistors are FETs.

10. A semiconductor electronic circuit according to claim 6, wherein said transistor is an FET.

11. A semiconductor electronic circuit according to claim 1, wherein said current source includes at least one bipolar transistor coupled to have a collector-emitter path in said series circuit to be in series with said first and second impedance means, and wherein said transistor circuit means includes at least one FET having a source-drain path coupled to the base of said bipolar transistor of the current source and having a gate coupled to receive said input signal.

12. A semiconductor electronic circuit according to claim 11, wherein said first and second impedance means are bipolar transistors each having collector-emitter paths in said series circuit to be in series with the collector-emitter path of said bipolar transistor of said current source.

13. A semiconductor electronic circuit according to claim 1, wherein the output current-output voltage characteristics of the drive means is such that the output current is substantially zero for both positive and negative output voltages within said predetermined vicinity of zero output voltage, and wherein the output current is not zero for both positive and negative output voltages outside said predetermined vicinity of zero output voltage.

14. A semiconductor electronic circuit according to claim 1, wherein said current source is composed of bipolar transistors coupled in said series circuit and said transistor circuit means includes field effect transistors coupled to said bipolar transistors.

15. A semiconductor electronic circuit according to claim 1, wherein said clamp applying means voltage is located in the proximity of a connection point between said current source and said drive means.

16. A semiconductor electronic circuit according to claim 1, wherein a plurality of input terminals are provided to receive input pulses for said drive means and wherein pulses at different input terminals have different delay times.

17. A semiconductor electronic circuit according to claim 1, wherein said transistor circuit means comprises a bipolar transistor having a base coupled to receive the input signal, a collector coupled to receive the clamp voltage and an emitter coupled to the current source means to provide the output of the drive means to the current source means.

18. A semiconductor electronic circuit according to claim 17, wherein said clamp voltage is set at substantially 0 volts.

19. A semiconductor electronic circuit according to claim 1, wherein said transistor circuit means comprises a field effect transistor having a gate coupled to receive the input signal, wherein said field effect transistor has a source-drain path coupled between the clamp voltage applying means and the current source means.

20. A semiconductor electronic circuit according to claim 19, wherein said clamp voltage is set at substantially 0 volts.

21. A semiconductor electronic circuit comprising:
first and second impedance means;
current source means coupled between said first and second impedance means so that said current source means and said first and second impedance means constitute a series circuit, said series circuit being coupled between first and second voltage source terminals; and
drive means coupled to receive an input signal and to provide an output to drive said current source means, said drive means including transistor circuit means possessing output current-output voltage characteristics for the drive means such that an output current of said drive means is substantially zero for a zero output voltage or for output voltages within a predetermined vicinity of a zero output voltage, and is not zero for output voltages other than zero volage or voltages not in the predetermined vicinity of a zero output voltage, wherein the output of said semiconductor electronic circuit is derived from one end of said current source means,
wherein the voltage of the output of said drive means applied to said current source is clamped to a predetermined voltage depending upon said characteristics of said drive means, and further
wherein said current source is composed of bipolar transistors coupled in said series circuit and said transistor circuit means includes field effect transistors coupled to said bipolar transistors.

22. A semiconductor electronic circuit comprising:
first and second impedance means;
current source means coupled between said first and second impedance means so that said current source means and said first and second impedance means constitute a series circuit, said series circuit being coupled between first and second voltage source terminals; and
drive means coupled to receive an input signal and to provide an output to drive said current source means, said drive means including transistor circuit means possessing output current-output voltage characteristics for the drive means such that an output current of said drive means is substantially zero for a zero output voltage or for output voltages within a predetermined vicinity of a zero output voltage, and is not zero for output voltages other than zero voltage or voltages not in the predetermined vicinity of a zero output voltage, wherein the output of said semiconductor electronic circuit is derived from one end of said current source means,
wherein the voltage of the output of said drive means applied to said current source is clamped to a predetermined voltage depending upon said characteristics of said drive means, and further wherein a plurality of input terminals are provided to receive input pulses for said drive means and wherein pulses at different input terminals have different delay times.

23. A semiconductor electronic circuit comprising:
first and second impedance means;
current source means coupled between said first and second impedance means so that said current source means and said first and second impedance means constitute a series circuit, said series circuit being coupled between first and second voltage source terminals; and
drive means coupled to receive an input signal and to provide an output to drive said current source means, said drive means including transistor circuit means possessing output current-output voltage characteristics for the drive means such that an output current of said drive means is substantially zero for a zero output voltage or for output voltages within a predetermined vicinity of a zero output voltage, and is not zero for output voltages other than zero voltage or voltages not in the predetermined vicinity of a zero output voltage, wherein the output of said semiconductor electronic circuit is derived from one end of said current source means,
wherein the voltage of the output of said drive means applied to said current source is clamped to a predetermined voltage depending upon said characteristics of said drive means, and further
wherein said impedance means are active elements.

24. A semiconductor electronic circuit according to claim 23, wherein said active elements include transistors.

25. A semiconductor electronic circuit according to claim 24, wherein said transistors are FETs.

26. A semiconductor electronic circuit comprising:
first and second impedance means;
current source means coupled between said first and second impedance means so that said current source means and said first and second impedance means constitute a series circuit, said series circuit being coupled between first and second voltage source terminals; and
drive means coupled to receive an input signal and to provide an output to drive said current source means, said drive means including transistor circuit means possessing output current-output voltage characteristics for the drive means such that an output current of said drive means is substantially zero for a zero output voltage or for output voltages within a predetermined vicinity of a zero output voltage, and is not zero for output voltages other than zero voltage or voltages not in the predetermined vicinity of a zero output voltage, wherein the output of said semiconductor electronic circuit is derived from one end of said current source means,
wherein the voltage of the output of said drive means applied to said current source is clamped to a predetermined voltage depending upon said characteristics of said drive means, and further
wherein said current source includes at least one bipolar transistor coupled to have a collector-emitter path in said series circuit to be in series with said first and second impedance means, and wherein said transistor circuit means includes at least one FET having a source-drain path coupled to the base of said bipolar transistor of the current source and having a gate coupled to receive said input signal.

27. A semiconductor electronic circuit according to claim 26, wherein said first and second impedance means are bipolar transistors each having collector-emitter paths in said series circuit to be in series with the collector-emitter path of said bipolar transistor of said current source.

28. A semiconductor electronic circuit comprising:
first and second impedance means;
current source means coupled between said first and second impedance means so that said current source means and said first and second impedance means constitute a series circuit, said series circuit being coupled between first and second voltage source terminals; and
drive means coupled to receive an input signal and to provide an output to drive said current source means, said drive means including transistor circuit means possessing output current-output voltage characteristics for the drive means such that an output current of said drive means is substantially zero for a zero output voltage or for output voltages within a predetermined vicinity of a zero output voltage, and is not zero for output voltages other than zero voltage or voltages not in the predetermined vicinity of a zero output voltage, wherein the output of said semiconductor electronic circuit is derived from one end of said current source means,
wherein the voltage of the output of said drive means applied to said current source is clamped to a predetermined voltage depending upon said characteristics of said drive means, and further
wherein the output current-output voltage characteristics of the drive means is such that the output current is substantially zero for both positive and negative output voltages within said predetermined vicinity of zero output voltage, and wherein the output current is not zero for both positive and negative output voltage outside said predetermined vicinity of zero output voltage.

* * * * *